United States Patent
Shaw et al.

(10) Patent No.: US 8,473,791 B2
(45) Date of Patent: Jun. 25, 2013

(54) REDUNDANT MEMORY TO MASK DRAM FAILURES

(75) Inventors: Mark Shaw, Plano, TX (US); Larry Thayer, Fort Collins, CO (US); Chris Petersen, Richardson, TX (US); Lidia Warnes, Roseville, CA (US); Dheemanth Nagaraj, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1426 days.

(21) Appl. No.: 11/742,446

(22) Filed: Apr. 30, 2007

(65) Prior Publication Data

US 2008/0270826 A1    Oct. 30, 2008

(51) Int. Cl.
*G11C 29/00*  (2006.01)

(52) U.S. Cl.
USPC ............................................ 714/710; 714/6.1

(58) Field of Classification Search
USPC .................. 714/710, 718, 723; 365/200–201
See application file for complete search history.

(56) References Cited

U.S. PATENT DOCUMENTS

| | | | | |
|---|---|---|---|---|
| 3,633,175 | A * | 1/1972 | Harper | 711/108 |
| 4,584,681 | A * | 4/1986 | Singh et al. | 714/7 |
| 6,963,516 | B2 * | 11/2005 | Blackmon et al. | 365/233.16 |
| 7,379,361 | B2 * | 5/2008 | Co et al. | 365/201 |
| 7,401,270 | B2 * | 7/2008 | Hummler | 714/710 |

* cited by examiner

*Primary Examiner* — Steve Nguyen

(57) ABSTRACT

A method comprises detecting a defective area in a Dynamic Random Access Memory (DRAM). The method further comprises establishing a redundant memory buffer at a per-memory module level. The method still further comprises loading the redundant memory buffer with a copy of data from the defective area. The method additionally comprises substituting data from the redundant memory buffer for data stored in the defective area upon a memory access to the defective area.

9 Claims, 2 Drawing Sheets

REDUNDANT MEMORY TO MASK DRAM FAILURES

BACKGROUND

As Dynamic Random Access Memory ("DRAM") density increases, and components on DRAM chips get smaller; DRAM in Dual Inline Memory Modules ("DIMMs") is more frequently affected by radiation that can cause a single bit to spontaneously flip to the opposite state. Additionally, with shrinking sizes of DRAM, manufacturing problem increase in number and frequency.

The DRAM manufacturing industry is highly competitive, and each manufacturer is under intense pressure to bring newer, better, smaller, and less expensive technologies to market. These pressures result in DIMMs shipping with DRAM defects that have yet to be handled. Because DIMMs ship with DRAM defects, it would be desirable to find a way to address DRAM defects without having to replace or repair a DIMM, and enable the system in which the DIMM is installed to continue to function as if no DRAM defects were present.

BRIEF DESCRIPTION OF THE DRAWINGS

For a detailed description of exemplary embodiments of the invention, reference will now be made to the accompanying drawings in which.

NOTATION AND NOMENCLATURE

Certain terms are used throughout the following description and claims to refer to particular system components. As one skilled in the art will appreciate, computer companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect, direct, optical or wireless electrical connection. Thus, if a first device couples to a second device, that connection may be through a direct electrical connection, through an indirect electrical connection via other devices and connections, through an optical electrical connection, or through a wireless electrical connection.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Figure 1:
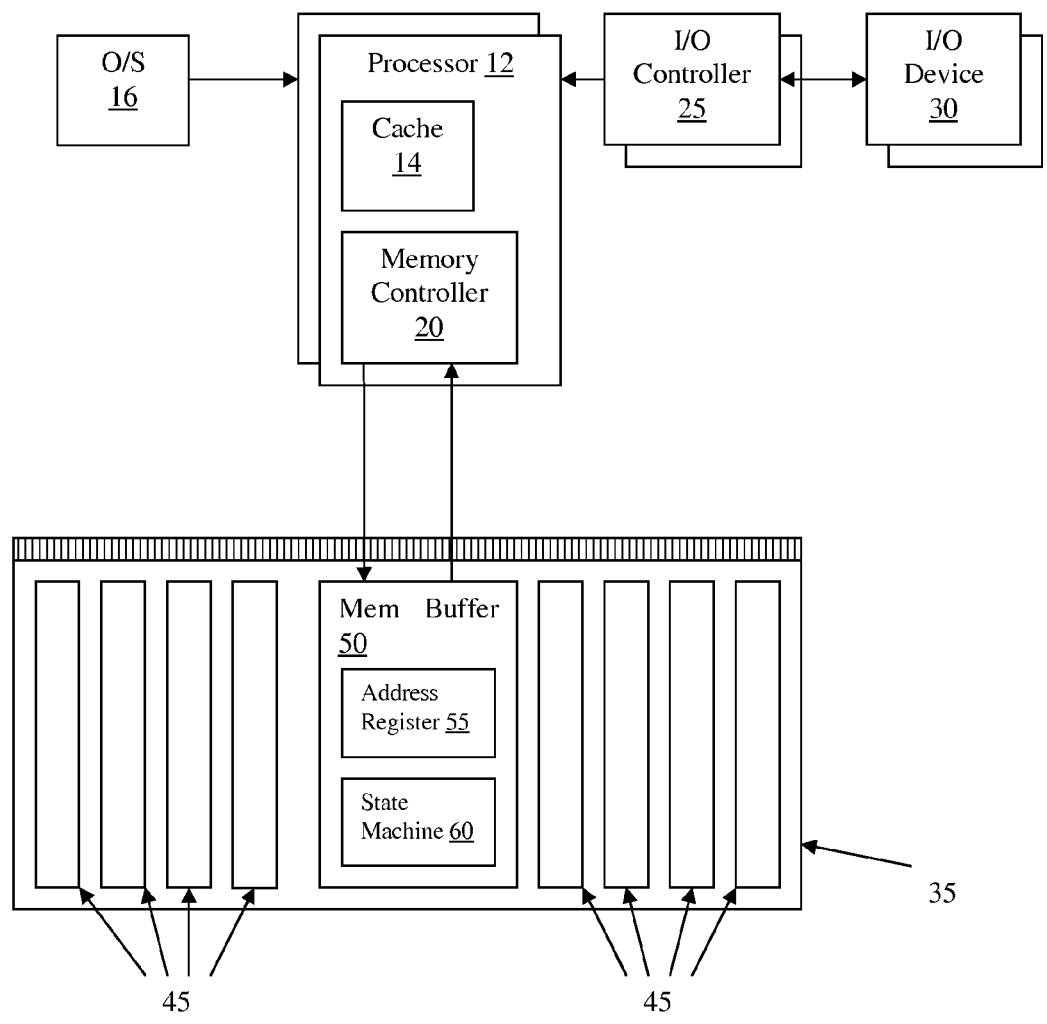
FIG. 1 shows a system in accordance with embodiments of the invention.

FIG. 1 shows a system 10 in accordance with embodiments of the invention. As shown, system 10 comprises one or more processors 12, a memory controller 20, one or more input/output (I/O) controllers 25, and memory 35. The memory controller 20 may be incorporated into the processor 12. An operating system 16 is also provided that is executed by each processor 12.

To the extent the system 10 comprises more than one I/O device 30, each such I/O device is associated with an I/O controller 25. Each I/O controller 25 interacts with its associated I/O device on behalf of the host system 10 (e.g., processor 12). For example, the I/O controller 25 may retrieve data from the I/O device and provide such I/O data to the processor 12 for further processing. The processor 12 can also send data and/or commands to the I/O device 30 via the I/O controller 25.

The memory controller 20 directly interacts with the memory 35 on behalf of the I/O controller 25 and processor 12. For example, the memory controller 20 receives write requests from the I/O controller 25 and writes the specified data to the memory 35. The memory controller 20 also receives read requests from the processor 12 and retrieves the targeted data from the memory 35 and provides such data to the processor.

In some embodiments, the memory 35 comprises a memory buffer 50 on the motherboard (i.e., a Buffer on Board) that drives the bus to one or more Dual Inline Memory Module ("DIMM") that includes a number of Dynamic Random Access Memories or "DRAMs" 45. Redundant memory may be allocated in content-addressable memory in the memory buffer on the motherboard.

In alternative embodiments, the memory 35 comprises, for example, an Advanced Memory Buffer ("AMB") 50 DIMM that includes a number of DRAMs 45. Redundant memory may be allocated in content-addressable memory in the AMB. In some embodiments, a plurality of DIMMs may comprise a memory subsystem (not shown).

In accordance with embodiments of the invention, when a DRAM is known to contain a defect, upon a write request from the I/O controller 25, data is written to the redundant memory in the AMB 50. Likewise, upon a read request from the processor 12, data from the buffer 50 may replace a selectable portion of the data that is stored in a defective DRAM 45.

The buffer 50 additionally implements an address register 55 and a state machine 60. The address register 55 contains the row address, column address, the bank, the rank, the location of the bad DRAM, and optionally, other information pertaining to the length of a transaction. The address register 55 may be loaded automatically, upon detection of a DRAM defect, by the state machine 60, or may be loaded by firmware.

The state machine 60 tracks the status of the redundant memory in the buffer 50. The state machine 60 has three states: "idle" wherein the redundant memory in the buffer 50 is not in use, "waiting" wherein the redundant memory in the buffer 50 are set up because a DRAM defect is known, and "valid" wherein the redundant memory in the buffer 50 are in use, such that when data is read from or written to memory, the memory access reads or write data from or to the redundant memory in the buffer 50 instead of a defective DRAM. In some embodiments, the state machine 60 may be firmware controlled, though alternatively, the state machine 60 is automatic. Such an automatic state machine 60 is programmed to automatically detect weak DRAM cells, and load the address registers and redundant memory of the buffer 50 with data, thereby eliminating firmware interaction.

In the simplest embodiment, a single buffer of redundant memory is implemented with the state machine and the address register employing a mask. Firmware, such as memory initialization code, detects a defect in a DRAM cell, row, column, or bank, and sets up the rank, bank, row, depth, and column address for the buffer redundant memory, as well as the position of the defective DRAM. Firmware may also set up an address mask, implemented as one of ordinary skill in the art would understand using content-addressable memory. Upon detecting the DRAM defect, the firmware transitions the state machine 60 from "idle" to "waiting." At some point, a memory access (i.e., a read request or a write request) is performed, triggering the redundant memory to be loaded with data. The state machine then transitions to "valid." Any subsequent write request overwrites the existing data in the buffer allocated in the redundant memory in the buffer 50, instead of the data in the defective DRAM. Any subsequent read request looks up the location of the data in the buffer in the address register, discards the defective DRAM data, and substitutes the data stored in the buffer allocated in the redundant memory of the buffer 50. The address mask renders transparent the process described here for handling DRAM defects.

In more advanced embodiments, multiple address registers and multiple buffers may be implemented. In the most advanced embodiment, a single large, variable data buffer is implemented with several address registers and a state machine for each address register. In such embodiments, the data buffer allocated by content-addressable memory of the buffer 50 is large enough to replace, for example, a single row, column, or bank of defective DRAM.

In some embodiments, not all of the address bits of the incoming commands are masked by the address mask to redirect the command into the redundant memory data buffer 50. In such embodiments, the address bits that are not masked off may be used to match the address of the incoming command as well as provide an index into the redundant memory of the data buffer. Thus, a single data buffer could support, for example, a one column failure or multiple cell failures.

In systems implementing a single DIMM on a channel, Error Correction Code ("ECC") may be implemented in memory 35. In such embodiments, the state machine 60 may be programmed to automatically detect defective cells, and automatically load the address registers and data buffer with data, thereby avoiding firmware interaction.

In some embodiments, a DRAM error may be transient. With a transient DRAM error, the state machine 60 continues in the idle state until the error occurs a predetermined threshold number of times. An error counter may be optionally employed to determine the number of times a DRAM error has occurred or is merely potentially transient. The error counter may comprise a designated counter in the memory buffer 50, or may be an error counter already in place used to determine when an error threshold has been reached. When the predetermined threshold number of error occurrences has been reached, the state machine 60 transitions to the "waiting" state, such that the next subsequent memory access involving the defective DRAM is serviced by the redundant memory buffer 50. In various embodiments, when the threshold is reached, the errors may be logged and the memory controller sends the address for the defective area of DRAM to load the state machine. In such embodiments, firmware reads the optional counters and/or optional "hard error" and "potential transient" status bits. If firmware determines that the error truly is a transient error, the firmware can force the state machine back to idle to turn off the spare-bit hardware.

Figure 2:
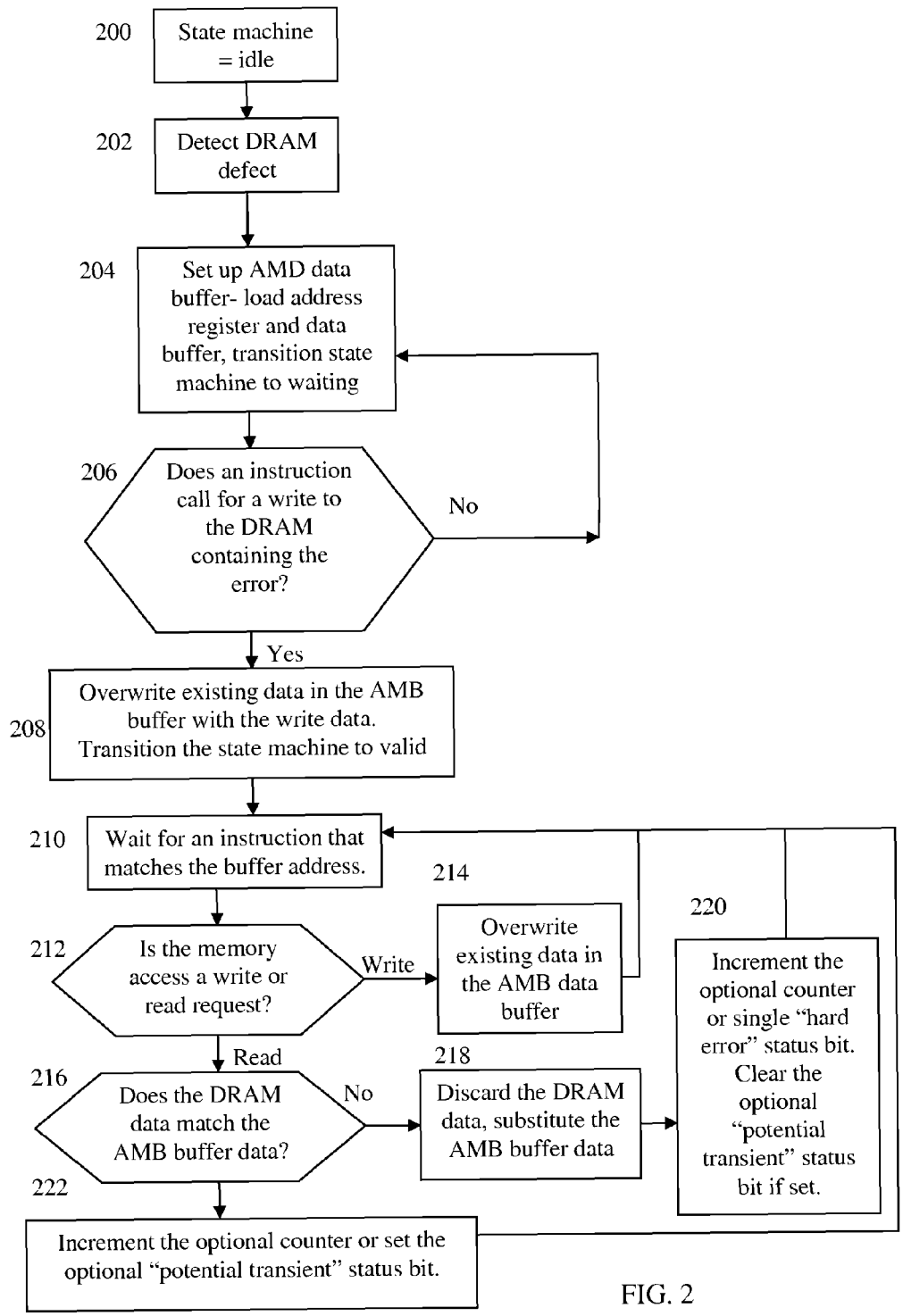
FIG. 2 shows a method in accordance with embodiments of the invention.

FIG. 2 illustrates a method 100 implemented on the system 10. At 200, the state machine 60 of the buffer 50 is in the "idle" state. At 202, a DRAM defect is detected. In some embodiments, the DRAM defect may be detected automatically in a self-test. In some embodiments, the DRAM defect may be detected after the memory 35 is functioning in a computer system.

At 204, the redundant memory in the buffer 50 is set up by loading the address register and data buffer, and transitioning the state machine to the "waiting" state. Specifically, the data buffer is loaded with the data stored in the defective area of DRAM, and the address register is loaded with a mapping between the data buffer and the address(es) for the defective area of DRAM. The set up in content-addressable memory may be performed in some embodiments by firmware, or alternatively, may be performed by the state machine automatically. The set up may include, more specifically, the rank, the bank, the row and column address, and the depth for the redundant memory data buffer, as well as the position of the defective DRAM and the address mask to direct a read or write command to the appropriate address in the redundant memory. In some embodiments, the depth may be implemented discretely, or alternatively, the depth may be integrated into the state machine by automatically detecting burst lengths from incoming command streams. In some embodiments, the set up activities of block 204 may be performed by memory initialization code in response to either failed self-tests or a failure history, if stored between boots in another memory (e.g., non-volatile memory).

At 206, a check is performed to determine if a control command is a memory access request involving a "write" to the defective DRAM. Specifically, the memory controller 20 determines whether a control command is a write access, and by checking the control command against the address register, it may be determined whether the control command writes to a cell or cells within the defective area of DRAM. In some embodiments, the firmware reads the optional counters and/or the optional "hard error" and "potential transient" status bits. If firmware determines that the error truly is a transient error, the firmware forces the state machine back to "idle" to turn off the spare-bit hardware.

If, at 206, the control command is not a write request, the method returns to block 204. If, at 206, the control command is a write request, then at 208 the state machine transitions from the "waiting" state to the "valid" state and the existing data in the AMB is overwritten with the write data. At block 210, the method proceeds with waiting for an instruction that matches the buffer address. At block 212, a determination is made as to whether a memory access to the buffer address is a write request or a read request. If the memory access is a write request, at block 214, the existing data in the AMB data buffer is overwritten, and the method returns to block 210. If at 212 the memory access is a read request, a determination is made of whether the DRAM data matches the AMB buffer data (block 216). If the DRAM data does not match the AMB buffer data, then at 218, the DRAM data is discarded and the AMB buffer data substituted for the discarded DRAM data. Then at 220, in embodiments that implement counters or "hard error" status buts, the optional counter or "hard error: status but is incremented and the optional "potential transient" status bit is cleared if it is set. If, at 216, the DRAM data does match the AMB buffer data, then at 222, in embodiments implementing the optional counter or "potential transient" status bit, the counter is incremented or the "potential transient" status bit is set, and the method returns to block 210.

Advantageously, the present disclosure results in DIMMs being functional despite DRAM failures within, thereby reducing downtime for computer systems employing the DIMMS due to DIMM repair. Likewise, DIMMs do not require replacement due to DRAM defects, thereby lowering costs. Additionally, there are fewer computer system crashes due to uncorrectable multi-bit errors, because data from defective regions in DRAM is replaced by buffer data.

Furthermore, by implementing redundant memory data buffers at the DIMM level, far more buffers may be implemented than if implementing data buffers within the memory controller. The present disclosure renders data buffers independent of the design and capacity of the memory controller, and features of the design may be used to target specific DRAM failure defects or specific failure modes of technologies supported by the AMB chip.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A method, comprising:
   detecting a defective area in a Dynamic Random Access Memory (DRAM) of a Dual Inline Memory Module (DIMM);
   in response to said detecting a defective area, establishing a redundant memory buffer using content addressable memory of a buffer chip accessible to all DRAMs of the DIMM and transitioning a state machine of the buffer chip from an idle state to a waiting state;
   loading the redundant memory buffer with a copy of data from the defective area; and
   upon a memory access to the defective area, substituting data from the redundant memory buffer for data stored in the defective area.

2. The method according to claim 1, wherein establishing the redundant memory buffer further comprises setting up an address register in the content addressable memory with a rank, a bank, a row, a column address and a depth for the redundant memory buffer.

3. The method according to claim 1, wherein establishing the redundant memory buffer further comprises setting up the content addressable memory with the position of the defective area in the DRAM.

4. The method according to claim 1, further comprising upon a memory access to the defective area, transitioning the state machine of the buffer chip from the waiting state to a valid state in order to activate the redundant memory buffer.

5. The method according to claim 1, further comprising discarding the data stored in the defective area in DRAM, and substituting the discarded data with data from the redundant memory buffer when the memory access comprises a read request.

6. The method according to claim 1, further comprising selectively changing a bit state between a first state and second state, wherein the first state indicates that an error caused by the defective area in DRAM is a hard error and the second state indicates that the error is a potentially transient error.

7. The method according to claim 1, further comprising overwriting existing data in the redundant memory buffer when the memory access comprises a write request.

8. The method according to claim 1, wherein the redundant memory buffer established in the buffer chip is variable in size based on the size of the defective area in DRAM.

9. The method according to claim 1, further comprising employing error correction code to detect the defective area automatically, and employing the state machine in the buffer chip to automatically set up an address register and load data from the defective area to the redundant memory buffer.

* * * * *